US012808921B2

(12) United States Patent
Kwang et al.

(10) Patent No.: US 12,808,921 B2
(45) Date of Patent: Nov. 24, 2026

(54) METHOD AND DEVICE FOR INSPECTING JUNCTION PORTION OF POWER MODULE

(71) Applicants: HYUNDAI MOTOR COMPANY, Seoul (KR); KIA CORPORATION, Seoul (KR)

(72) Inventors: Tae Woo Kwang, Hanam-si (KR); Young Jin Son, Suwon-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 203 days.

(21) Appl. No.: 18/593,163

(22) Filed: Mar. 1, 2024

(65) Prior Publication Data

US 2025/0116695 A1 Apr. 10, 2025

(30) Foreign Application Priority Data

Oct. 5, 2023 (KR) ........................ 10-2023-0132215

(51) Int. Cl.
*G01R 31/26* (2020.01)
*G01K 7/02* (2021.01)

(52) U.S. Cl.
CPC ......... *G01R 31/2619* (2013.01); *G01K 7/021* (2013.01); *G01K 2217/00* (2013.01)

(58) Field of Classification Search
None
See application file for complete search history.

(56) References Cited

U.S. PATENT DOCUMENTS

2017/0337461 A1* 11/2017 Jesme ........................ G01K 7/00
2020/0051834 A1* 2/2020 Chandrasekharan ........................ H01J 37/32724
2021/0063335 A1 3/2021 Kranz
2022/0289030 A1* 9/2022 Pressman .............. B60L 3/0046
2025/0076390 A1* 3/2025 Kwang .............. G01R 31/3835
(Continued)

FOREIGN PATENT DOCUMENTS

CN 107072551 A * 8/2017 ............. G01N 27/18
JP 2011-203113 A 10/2011
JP 6656501 B1 3/2020
(Continued)

OTHER PUBLICATIONS

English translation of TW 201636902 A (Year: 2016).*
English translation of CN 107072551 A (Year: 2017).*

*Primary Examiner* — Jermele M Hollington
(74) *Attorney, Agent, or Firm* — MCDONNELL BOEHNEN HULBERT & BERGHOFF LLP

(57) ABSTRACT

A method for inspecting a junction portion of a power module includes measuring a primary voltage for the power module, applying a heating current to the power module to heat the power module, releasing the application of the heating current and simultaneously measuring a secondary voltage for the power module and cooling the power module, calculating a temperature change amount based on the measured value of the primary voltage and the measured value of the secondary voltage, calculating thermal resistance based on an amount of power applied to the power module and the calculated amount of temperature change, and determining whether the junction portion of the power module is defective, based on the calculated thermal resistance.

10 Claims, 5 Drawing Sheets

(56) References Cited

U.S. PATENT DOCUMENTS

| | | | | |
|---|---|---|---|---|
| 2025/0105063 | A1 * | 3/2025 | Kwang | ................. H10P 74/207 |

FOREIGN PATENT DOCUMENTS

| | | | | | |
|---|---|---|---|---|---|
| JP | 2022-164071 | A | | 10/2022 | |
| KR | 10-1066858 | B1 | | 9/2011 | |
| KR | 2021-0028571 | A | | 3/2021 | |
| KR | 10-2406801 | B1 | | 6/2022 | |
| TO | 201636902 | A | * | 10/2016 | ......... G06K 19/0773 |

* cited by examiner

METHOD AND DEVICE FOR INSPECTING JUNCTION PORTION OF POWER MODULE

CROSS REFERENCE TO RELATED APPLICATIONS

This application claims benefit of priority to Korean Patent Application No. 10-2023-0132215 filed on Oct. 5, 2023 in the Korean Intellectual Property Office, the disclosure of which is incorporated herein by reference in its entirety.

BACKGROUND

1. Field

The present disclosure relates to a method and device for inspecting a junction portion of a power module, and more particularly, to a method and device for measuring thermal resistance and detecting defects in the junction portion based on the measured thermal resistance value.

2. Description of Related Art

A power module includes a power semiconductor, and the power semiconductor is bonded to a substrate and/or spacer constituting the power module. Bonding of the power semiconductor may be performed through soldering or sintering. Specifically, a solder member or sintered member may be disposed between components to be bonded and heat is applied to melt the solder member or sintered member to form a junction portion or a junction layer. At this time, bubbles may be generated as the solder member or sintered member melts, and if the bubbles are not removed during the bonding process, void defects may occur in the junction portion.

In the related art, in order to detect defects in junction portions, images were generated using X-rays or ultrasonic waves using a non-destructive transmission method, and defects were determined based on the generated images. However, the generated images may have low resolution, and accuracy may deteriorate when defects are detected using such images with low resolution.

In addition, since the process of determining defects through images is performed based on an operator's subjective determination, there is a high possibility that false defects will occur.

SUMMARY

An aspect of the present disclosure is to provide a method and device for inspecting a junction portion of a power module, capable of improving detection accuracy by measuring thermal resistance and quantitatively detecting defects in the junction portion based on the measured thermal resistance value.

According to an aspect of the present disclosure, a method for inspecting a junction portion of a power module includes measuring a primary voltage for the power module, applying a heating current to the power module to heat the power module, releasing the application of the heating current and simultaneously measuring a secondary voltage for the power module and cooling the power module, calculating a temperature change amount based on the measured value of the primary voltage and the measured value of the secondary voltage, calculating thermal resistance based on an amount of power applied to the power module and the calculated amount of temperature change, and determining whether the junction portion of the power module is defective, based on the calculated thermal resistance.

The measuring of the primary voltage and the measuring of the secondary voltage include applying a sensing current to at least a portion of the power module.

The sensing current may be applied to a semiconductor device included in the power module, and in the measuring of the primary voltage and the measuring of the secondary voltage, a voltage applied to the semiconductor device when the sensing current flows may be measured.

The sensing current may be applied to calculate a temperature of the junction portion provided in the power module, and the heating current may be applied to heat at least a portion of the power module to a predetermined temperature.

The sensing current may have a lower intensity than that of the heating current.

The calculating of the amount of temperature change may include calculating an initial temperature of the junction portion based on the measured value of the primary voltage and calculating an increased temperature of the junction portion based on the measured value of the secondary voltage.

The calculating of the temperature with the voltage may be performed based on a function defining between voltage and temperature, and the function is calculated in advance.

The function may be calculated by measuring a voltage applied to at least a portion of the power module under a plurality of temperature conditions.

The applying of the heating current may be performed for a first reference time, and the measuring of the secondary voltage and the cooling of the power module may be performed for a second reference time, longer than the first reference time.

In the determining whether the junction portion of the power module is defective, the junction portion may be determined to be defective when the calculated thermal resistance is higher than a reference thermal resistance value.

The power module to be inspected may be a double-sided cooling power module and may be provided with the semiconductor device bonded to upper and lower substrates through a junction member before being molded.

According to another aspect of the present disclosure, a device for inspecting a junction portion of a power module includes a first plate including a first cooling block, a second plate including a second cooling block and rotatably connected to the first plate, and a refrigerant pipe provided to pass through at least a portion of each of the first plate and the second plate and through which a refrigerant for cooling the first cooling block and the second cooling block flows, wherein the first cooling block and the second cooling block are provided to cool the power module to be inspected.

A folded state and an unfolded state may be switched as the first plate and the second plate rotate, relative to each other.

The first cooling block and the second cooling block may be disposed on a first surface of the first plate and a second surface of the second plate, respectively, facing each other in the folded state of the inspection device.

The first cooling block may be provided to protrude from the first surface of the first plate at a predetermined height, and the second cooling block may be provided to protrude from the second surface of the second plate at a predetermined height.

In the folded state of the inspection device, the power module may be mounted to contact the first cooling block and the second cooling block.

The first cooling block may be in contact with at least a portion of the upper substrate of the power module, and the second cooling block may be in contact with at least a portion of the lower substrate of the power module.

The first cooling block and the second cooling block may contact a metal layer of the upper substrate and a metal layer of the lower substrate, respectively, and may be formed of a material the same as that of the metal layer.

The first cooling block and the second cooling block may respectively be provided in plural.

The device may further include: a current applying unit applying current to the power module.

BRIEF DESCRIPTION OF THE FIGURES

The above and other aspects, features, and advantages of the present disclosure will be more clearly understood from the following detailed description, taken in conjunction with the accompanying drawings, in which.

DETAILED DESCRIPTION

Figure 1:
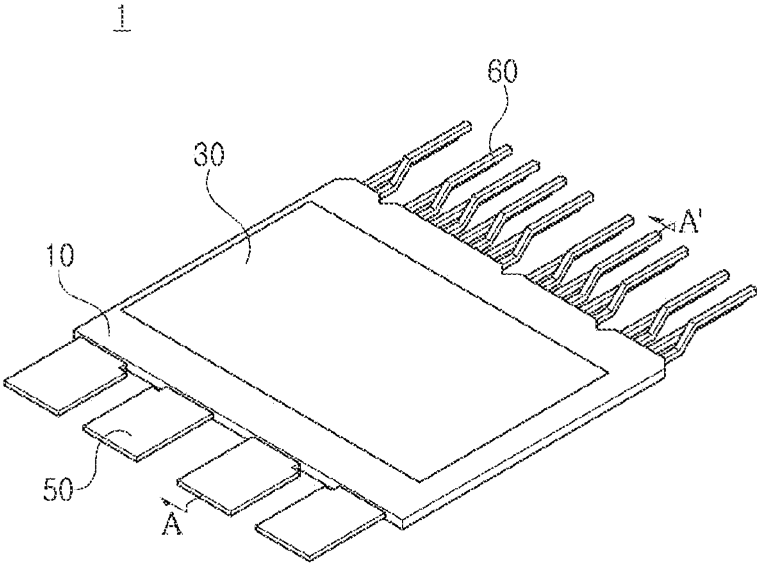
FIG. 1 is a perspective view of a power module according to an exemplary embodiment in the present disclosure.

While the present disclosure may be modified in various manners and take on various alternative forms, specific embodiments thereof are illustrated in the drawings and described in detail below. However, it should be understood that there is no intent to limit the present disclosure to the particular forms disclosed, but on the contrary, the present disclosure covers all modifications, equivalents, and alternatives falling within the spirit and scope of the present disclosure.

It will be understood that, although the terms "first," "second," etc. may be used herein to describe various elements, these elements should not be limited by these terms. These terms are only used to distinguish one element from another. For example, a first element could be termed a second element, and a second element could similarly be termed a first element without departing from the scope of the present disclosure. As used herein, the term "and/or" includes any and all combinations of one or more of the associated listed items.

The terminology used herein to describe embodiments of the present disclosure is not intended to limit the scope of the present disclosure. The articles "a," and "an" are singular in that they have a single referent, however the use of the singular form in the present document should not preclude the presence of more than one referent. In other words, elements of the present disclosure referred to in the singular may number one or more, unless the context clearly indicates otherwise. It will be further understood that the terms "comprise," "comprising," "include," and/or "including," when used herein, specify the presence of stated features, numbers, operations, operations, elements, and/or components but do not preclude the presence or addition of one or more other features, numbers, operations, operations, elements, components, and/or groups thereof.

If it is not contrarily defined, all terms used herein including technological or scientific terms have the same meanings as those generally understood by a person with ordinary skill in the art. Terms defined in generally used dictionary shall be construed that they have meanings matching those in the context of a related art, and shall not be construed in ideal or excessively formal meanings unless they are clearly defined in the present application.

Hereinafter, exemplary embodiments in the present disclosure will be described with reference to the drawings.

Figure 2:
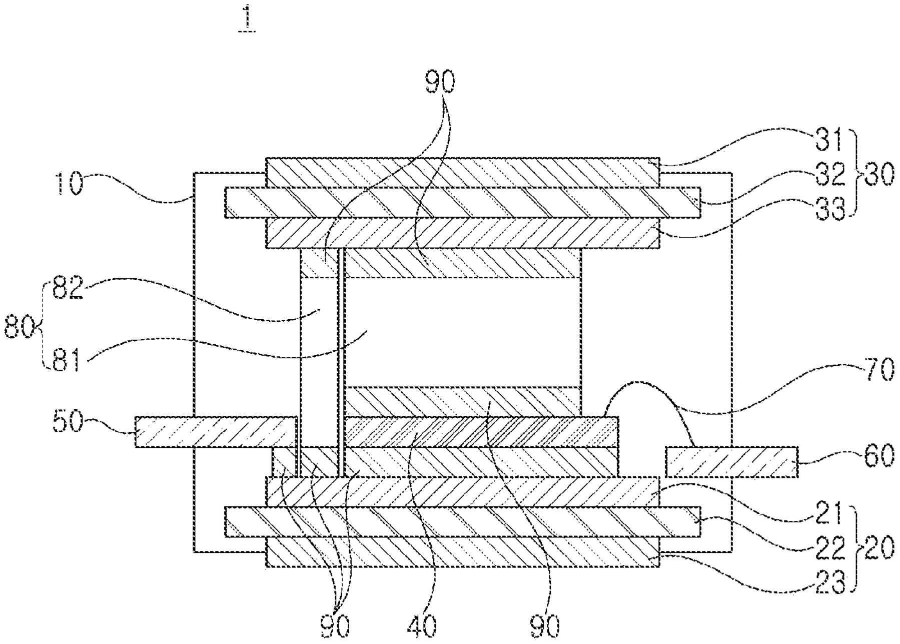
FIG. 2 is a cross-sectional view of a power module according to an exemplary embodiment in the present disclosure.

FIG. 1 is a perspective view of a power module according to an exemplary embodiment in the present disclosure. FIG. 2 is a cross-sectional view of a power module according to an exemplary embodiment in the present disclosure.

FIG. 2 is a diagram illustrating a cross-section taken along line A-A' of a power module 1 illustrated in FIG. 1.

Referring to FIGS. 1 and 2, the power module 1 according to an exemplary embodiment may include at least a housing 10, a substrate 20 or 30, and a semiconductor device 40. In detail, the power module 1 of an exemplary embodiment may further include at least some of a power lead 50, a signal lead 60, a wire 70, a spacer 80, and a junction member 90.

The housing 10 may accommodate at least some of the components constituting the power module 1 therein. For example, the housing 10 may cover the components arranged between the lower substrate 20 and the upper substrate 30 so that at least some of the lower substrate 20, the upper substrate 30, the power lead 50, and the signal lead 60 are exposed to the outside of the housing 10. The housing 10 may be a molding portion formed of an insulating material molding the components constituting the power module 1.

The lower substrate 20 may include an insulating layer 22 and metal layers 21 and 23 disposed on both sides of the insulating layer 22. The metal layers 21 and 23 may include a first metal layer 21 bonded to an upper surface of the insulating layer 22 and a second metal layer 23 bonded to a lower surface of the insulating layer 22. The first metal layer 21 of the lower substrate 20 may be in electrical contact with the lower surface of the semiconductor device 40. At least a portion (e.g., the lower surface) of the second metal layer 23 of the lower substrate 20 may be located outside the housing 10 to be exposed externally. Although not illustrated, the second metal layer 23 of the lower substrate 20 may be in contact with a cooling channel for cooling the power module 1.

The upper substrate 30 may include an insulating layer 32 and metal layers 31 and 33 disposed on both sides of the insulating layer 32. The metal layers 31 and 33 may include a first metal layer 33 bonded to the lower surface of the insulating layer 32 and a second metal layer 31 bonded to the upper surface of the insulating layer 32. The first metal layer 33 of the upper substrate 30 may be in electrical contact with an upper surface of the semiconductor device 40 through a first spacer 81. At least a portion (e.g., an upper surface) of the second metal layer 31 of the upper substrate 30 may be located outside the housing 10 to be exposed externally. Although not illustrated, the second metal layer 31 of the upper substrate 30 may be in contact with a cooling channel for cooling the power module 1.

The lower substrate 20 and the upper substrate 30 may be double bonded copper (DBC) substrates. For example, in the upper substrate 30 and the lower substrate 20, the insulating layers 22 and 32 may be formed of a ceramic material and the metal layers 21, 23, 31 and 33 may be formed of a copper material, but are not limited thereto.

The lower substrate 20 and the upper substrate 30 may be electrically connected through the spacer 80. For example, the first metal layer 21 of the lower substrate 20 and the first metal layer 33 of the upper substrate 30 may be electrically connected through the second spacer 82. A portion of the first metal layer 21 of the lower substrate 20 electrically connected to the lower surface of the semiconductor device 40 and a portion of the first metal layer 33 of the upper substrate 30 through the second spacer 82 may be configured to be electrically insulated from each other.

The semiconductor device (or a semiconductor chip) 40 may be disposed between the lower substrate 20 and the upper substrate 30. For example, the semiconductor device 40 may be bonded to the first metal layer 21 of the lower substrate 20 and located between the lower substrate 20 and the upper substrate 30. The semiconductor device 40 may be electrically connected to the upper substrate 30 and the lower substrate 20. For example, power terminals (not shown) to and from which current is input and output for power conversion may be formed respectively on the upper and lower surfaces of the semiconductor device 40. The power terminal formed on the lower surface may be electrically connected to the lower substrate 20, and the power terminal formed on the upper surface may be electrically connected to the upper substrate 30. The semiconductor device 40 may be configured as an insulated gate bipolar transistor (IGBT) and a diode, but is not limited thereto.

The lower surface of the semiconductor device 40 may be bonded to the first metal layer 21 of the lower substrate 20 through the junction member 90. The upper surface of the semiconductor device 40 may be bonded to the first spacer 81 through the junction member 90. For example, the semiconductor device 40 may be electrically connected to the first metal layer 33 of the upper substrate 30 through the first spacer 81. The semiconductor device 40 may be electrically connected to the signal lead 60 through the wire 70.

The power lead 50 may be connected to the semiconductor device 40 and may transmit and receive high-voltage current. The power lead 50 may be electrically connected to the semiconductor device 40. The power lead 50 may be provided in plural. At least a portion of the power lead 50 may be electrically bonded to the first metal layer 21 of the lower substrate 20 through the junction member 90. For example, the power lead 50 may be bonded to the upper surface of the first metal layer 21 of the lower substrate 20 along with the semiconductor device 40. A portion of the power lead 50 may be exposed to the outside of the housing 10 in order to transmit and receive power to and from the outside of the power module 1. The power lead 50 may extend from the inside of the housing 10 toward the outside of the housing 10 so that at least a portion thereof is exposed to the outside of the housing 10.

The signal lead 60 may receive a control signal for controlling the semiconductor device 40 from the outside of the power module 1. The signal lead 60 may be provided in plural. The signal lead 60 may extend from the inside of the housing 10 toward the outside of the housing 10 so that at least a portion thereof is exposed to the outside of the housing 10. The signal lead 60 may be electrically connected to the semiconductor device 40 through the wire 70.

The spacer 80 may include a first spacer 81 disposed between the upper substrate 30 and the semiconductor device 40 and a second spacer 82 disposed between the upper substrate 30 and the lower substrate 20.

An upper surface of the first spacer 81 may be bonded to the first metal layer 33 and a lower surface thereof may be bonded to the semiconductor device 40 to establish an electrical connection between the upper substrate 30 and the semiconductor device 40. For example, the upper and lower surfaces of the first spacer 81 may electrically and physically contact the first metal layer 33 of the upper substrate 30 and the upper surface of the semiconductor device 40 through the junction member 90, respectively.

An upper surface of the second spacer 82 may be bonded to the first metal layer 33 of the upper substrate 30 and a lower surface thereof may be bonded to the first metal layer 21 of the lower substrate 20 to establish an electrical connection between the upper substrate 30 and the lower substrate 20. For example, the upper and lower surfaces of the second spacer 82 may be electrically and physically contact the first metal layer 33 (e.g., the lower surface of the first metal layer 33) of the upper substrate 30 and the first metal layer 21 (e.g., the upper surface of the first metal layer 21) of the lower substrate 20 through the junction member 90, respectively.

As illustrated in FIGS. 1 and 2, the power module 1 according to an exemplary embodiment may be a double-sided cooling (DSC) power module configured such that the semiconductor device 40 is disposed between the upper substrate 30 and the lower substrate 20. However, the structure of the power module 1 is not limited to the illustrated exemplary embodiment and may be variously modified within a range in which a structure in which the semiconductor device 40 is disposed between the upper and lower substrates 20 and heat generated by the semiconductor device 40 is cooled by a cooler (not shown) installed outside the two substrates is realized.

The junction member 90 may electrically and physically bond components disposed on both sides of the junction member 90. For example, the components disposed on both sides of the junction member 90 may be electrically connected through the junction member 90 and may also be mechanically (or physically) coupled to each other. The junction member 90 may include various materials capable of soldering and/or sintering. For example, the junction member 90 may be referred to as a soldering member and/or a sintering member.

The method and device for inspecting a junction portion described below are for detecting defects in a junction portion (e.g., at least one of a junction part, a junction region, and a junction surface) of the power module 1 formed through the junction member 90 and may detect defects due to voids and/or lack of density at the bonding portion.

Figure 3:
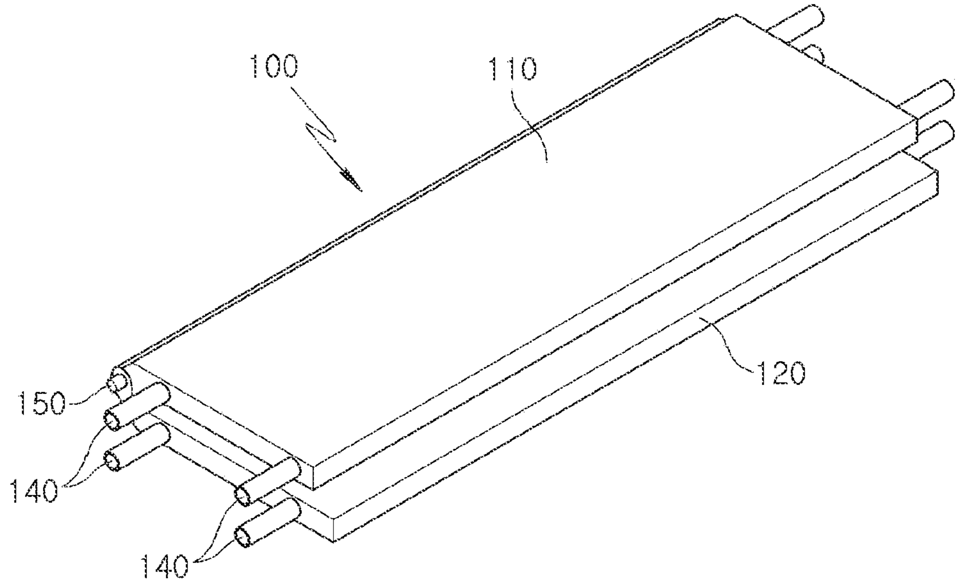
FIG. 3 is a perspective view of a device for inspecting a junction portion of a power module according to an exemplary embodiment in the present disclosure.
Figure 4:
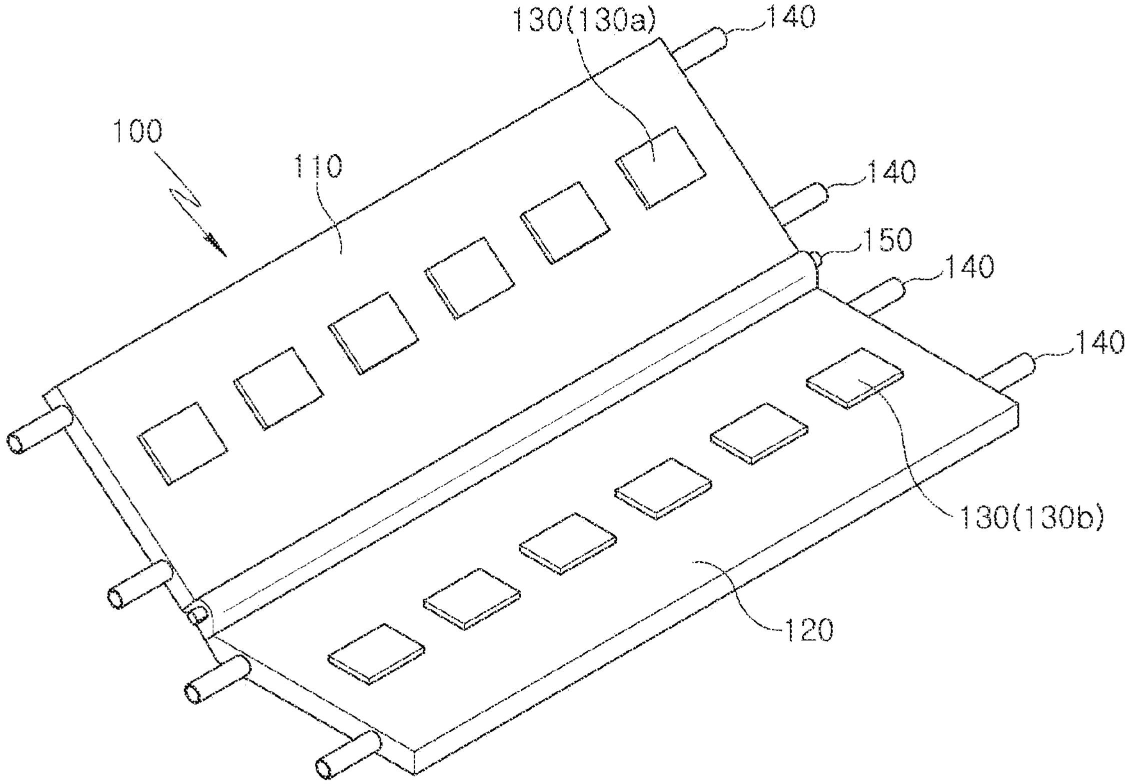
FIG. 4 is a perspective view of a device for inspecting a junction portion of a power module according to an exemplary embodiment in the present disclosure.

FIG. 3 is a perspective view of a device for inspecting a junction portion of a power module according to an exemplary embodiment in the present disclosure. FIG. 4 is a perspective view of a device for inspecting a junction portion of a power module according to an exemplary embodiment in the present disclosure.

FIG. 3 illustrates a folded state of a junction portion inspection device 100, and FIG. 4 illustrates an unfolded state of the junction portion inspection device 100.

Figure 7:
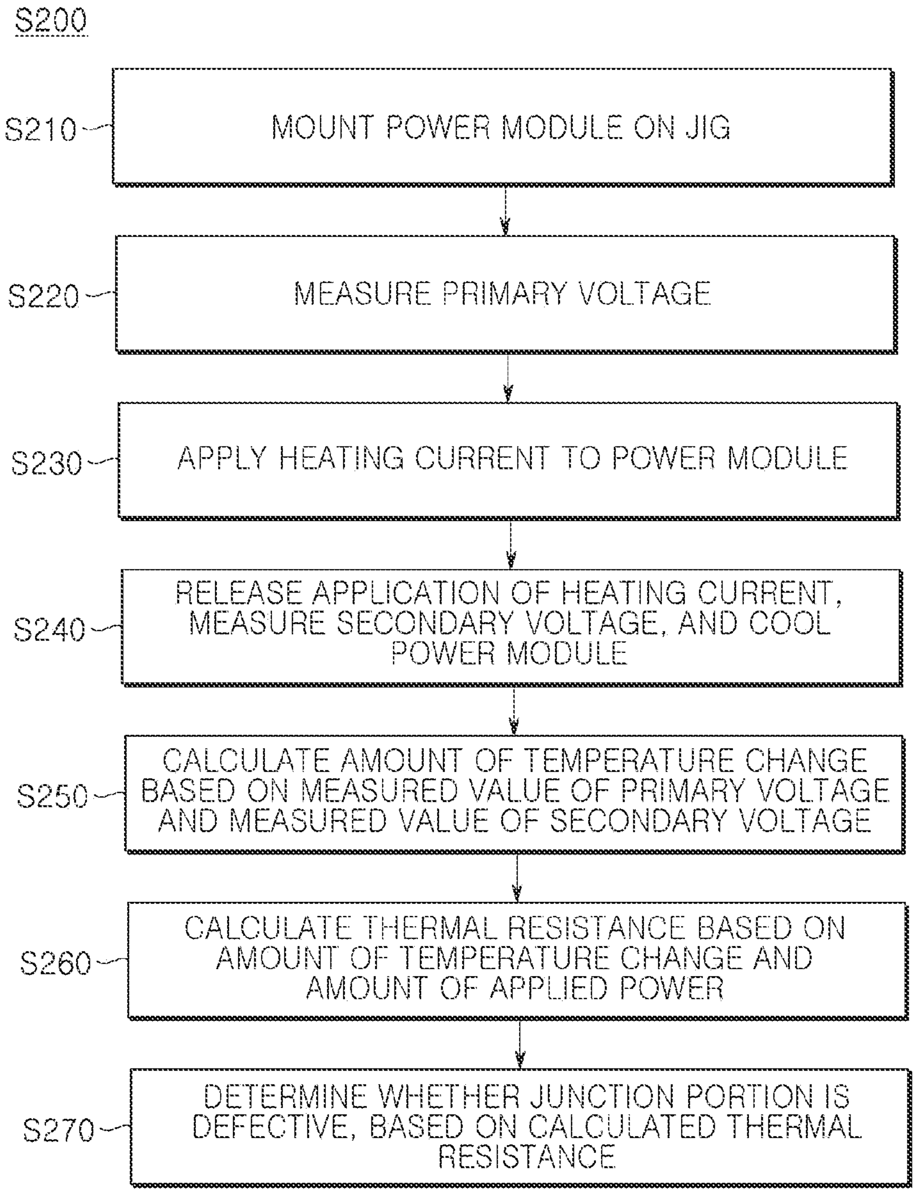
FIG. 7 is a flowchart of a method for inspecting a junction portion of a power module according to an exemplary embodiment in the present disclosure.

Referring to FIGS. 3 and 4, the junction portion inspection device 100 according to an exemplary embodiment inspects or detects whether a junction portion of the power module 1 is defective, based on thermal resistance (e.g., the detection method of FIG. 7 (S200)) and may be provided to cool and/or heat the power module 1 to measure and/or calculate thermal resistance. According to various exemplary embodiments, the inspection device 100 may be referred to as an inspection jig. The method of detecting a defect in a junction portion using the junction portion inspection device 100 of FIGS. 3 and 4 will be described in more detail below with reference to FIG. 7.

The junction portion inspection device 100 of an exemplary embodiment may include at least a first plate 110, a second plate 120, and a cooling block 130. More specifically, the junction portion inspection device 100 of an exemplary embodiment may include a cooling unit for the cooling block 130, such as a refrigerant pipe 140, a thermoelectric element, a Peltier element, etc.

The first plate 110 and the second plate 120 may be connected to each other so that they may be folded or rotated, and to this end, a hinge 150 or the like may be used.

The junction portion inspection device 100 may be transformed/switched into a folded state or an unfolded state as the first plate 110 and the second plate 120 rotate with respect to each other. The cooling block 130 and a refrigerant pipe 140 may be provided in each of the first plate 110 and the second plate 120. In various exemplary embodiments, the first plate 110 and the second plate 120 may be formed of a SUS (steel, use, stainless) material, but are not limited thereto.

The cooling block 130 may be provided to contact an object to be inspected to cool the object to be inspected. The cooling block 130 may be disposed in each of the first plate 110 and the second plate 120. For example, the cooling block 130 may include a first cooling block 130*a* disposed on the first plate 110 and a second cooling block 130*b* disposed on the second plate 120. The cooling block 130 may be provided so that the first cooling block 130*a* and the second cooling block 130*b* may be spaced apart from each other and face each other when the junction portion inspection device 100 is in a folded state.

The first cooling block 130*a* may be disposed on one surface of the first plate 110 facing the second plate 120 in a folded state. The second cooling block 130*b* may be disposed on one surface of the second plate 120 facing the first plate 110 in a folded state.

The first cooling block 130*a* and the second cooling block 130*b* may be arranged on one surface of each of the first plate 110 and the second plate 120. Accordingly, inspection may be performed by mounting multiple objects to be inspected on the inspection device.

The cooling block 130 may be cooled by refrigerant flowing through the refrigerant pipe 140. For example, the first cooling block 130*a* may be cooled to a predetermined temperature by the refrigerant flowing through the refrigerant pipe 140 provided in the first plate 110, and the second cooling block 130*b* may be cooled to a predetermined temperature by the refrigerant flowing through the refrigerant pipe 140 provided in the plate 120.

The refrigerant pipe 140 may be provided on each of the first plate 110 and the second plate 120 to allow the refrigerant for cooling the cooling block 130 to flow therethrough. The refrigerant pipe 140 may be provided to penetrate through the inside of the first plate 110 and the second plate 120. At least a portion of the refrigerant pipe 140 may be embedded inside the first plate 110 and the second plate 120 so that cold heat of the refrigerant flowing therethrough may be transferred to the cooling block 130. The type of refrigerant flowing through the refrigerant pipe 140 is not particularly limited, and various types of refrigerant may be appropriately applied in response to a temperature of the cooling block 130 and a temperature at which the object to be inspected is to be cooled.

Figure 5:
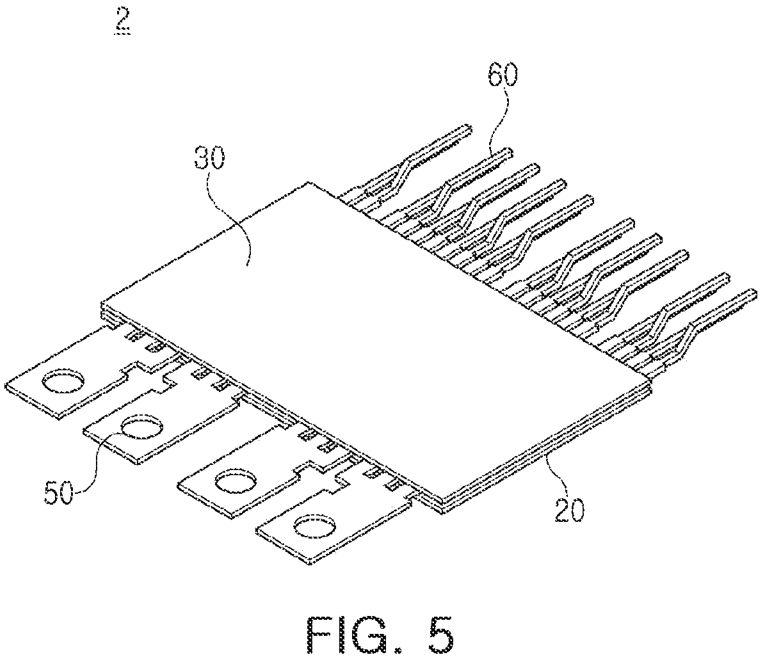
FIG. 5 illustrates the form of a power module to be inspected for a defective junction portion using a junction portion inspection device illustrated in FIGS. 3 and 4.
Figure 6:
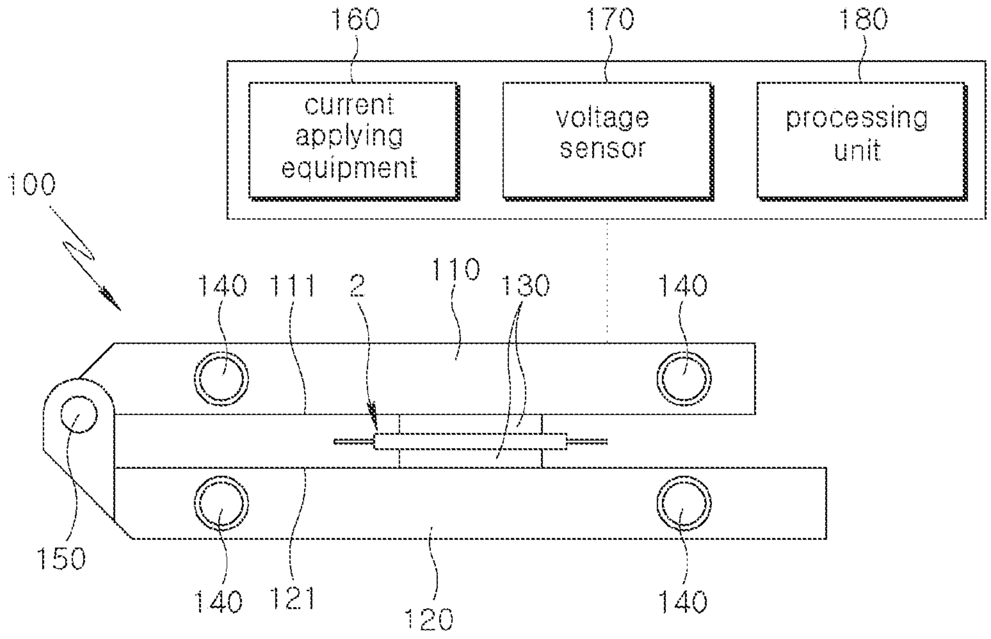
FIG. 6 illustrates an operation of inspecting the junction portion of the power module to be inspected illustrated in FIG. 5 through the junction portion inspection device illustrated in FIGS. 3 and 4.

FIG. 5 illustrates the form of a power module to be inspected for a defective junction portion using the junction portion inspection device illustrated in FIGS. 3 and 4. FIG. 6 illustrates an operation of inspecting the junction portion of the power module to be inspected illustrated in FIG. 5 through the junction portion inspection device illustrated in FIGS. 3 and 4.

FIGS. 5 and 6 are diagrams illustrating an operation of inspecting whether a junction portion of a power module 2 is defective through the junction portion inspection device 100 described above with reference to FIGS. 3 and 4. Hereinafter, FIGS. 3 and 4 are referred to together in describing FIGS. 5 and 6.

Referring to FIGS. 5 and 6, an object to be inspected for defects in the junction portion using the junction portion inspection device 100 according to an exemplary embodiment may not be the power module 1 in a finished product state illustrated in FIGS. 1 and 2 but be the power module 2 in a state of half-finished goods or work in process.

Referring to FIG. 5, the power module 2 to be inspected is in a state before being completed as the finished power module 1 and may be a state before a process of molding with a housing (e.g., the housing 10 in FIGS. 1 and 2) is performed.

The power module 2 to be inspected may include the upper substrate 30, the lower substrate 20, the power lead 50, and the signal lead 60. For example, the power module 2 to be inspected may be in a form in which a semiconductor device (e.g., the semiconductor device 40 in FIG. 2) is bonded to the upper substrate 30 and the lower substrate 20 through the junction member 90, and when the housing 10 is formed by wrapping at least a portion thereof with a molding material, the finished power module 1 is completed. Although not illustrated, the power module 2 to be inspected may have a cross-section excluding the housing 10 in the cross-sectional view of the power module 1 in FIG. 2 and include the wire 70, the spacer 80, and the junction member 90.

The purpose of the junction portion inspection method according to an exemplary embodiment in the present disclosure is to detect defects in the junction portion before molding. However, it is not that the inspection method of the present disclosure is not performed on the finished power module 1 just because the power module 2 to be inspected is not in a finished product state, and according to various exemplary embodiments, the inspection method of the present disclosure may also be applied to the finished power module 1.

Referring to FIG. 6, the power module 2 to be inspected may be mounted on the junction portion inspection device 100 in a folded state (e.g., the state illustrated in FIG. 3). The power module 2 to be inspected may be in contact with the cooling block 130 provided on each of the first plate 110 and the second plate 120 while being mounted on the junction portion inspection device 100. For example, depending on the direction in which the power module 2 to be inspected is mounted, any one of the upper substrate 30 and the lower substrate 20 may be in contact with the cooling block 130*a* (e.g., the first cooling block 130*a*) of the first plate 110 and the other thereof may be in contact with the cooling block 130*b* (e.g., the second cooling block 130*b*) of the second plate 120.

The cooling block 130 may be provided to protrude from one surface of each of the first plate 110 and the second plate 120 at a predetermined height. For example, the cooling block 130*a* (or the first cooling block 130*a*) of the first plate 110 may protrude from the first surface 111 of the first plate 110 at a predetermined height, and the cooling block 130*b* (or the second cooling block 130*b*) of the second plate 120 may protrude from the second surface 121 of the first plate 110 at a predetermined height. Here, the first surface 111 and the second surface 121 may face each other in the folded state of the junction portion inspection device 100. Accordingly, only the upper substrate 30 and the lower substrate 20 of the power module 2 to be inspected are in contact with the cooling block 130, while the signal lead 60 and/or power lead 50 are not in contact with the cooling block 130, the first plate 110, and the second plate 120, and thus, bending or damage may be prevented.

The cooling block 130 may be formed of the same material as that of portions of the upper substrate 30 and the lower substrate 20 with which the cooling block 130 is in contact. The cooling block 130 is in contact with the outermost metal layer of the upper substrate 30 (e.g., the second metal layer 31 of the upper substrate 30 in FIG. 2) and the outermost metal layer (e.g., the second metal layer 23) of the lower substrate 20 in FIG. 2) to cool the power module 2 to be inspected during the inspection process. The cooling block 130 may be formed of the same material as that of the metal layers 23 and 31 of the upper substrate 30 and the lower substrate 20. For example, when the metal layers 23 and 31 of the upper substrate 30 and the lower substrate 20 are formed of copper (Cu), the cooling block 130 may also be formed of copper (Cu). However, the material of the metal layers 23 and 31 and the cooling block 130 is not limited to copper (Cu).

As the metal layers 23 and 31 of the upper and lower substrates 20 and 30 in contact with the cooling block 130 and the cooling block 130 are formed of the same material, the coefficients of thermal expansion of the objects in contact may be equal. Through this, warpage occurring due to a difference in the coefficient of thermal expansion as the temperature increases may be prevented, and the contact between the power module 2 to be inspected and the junction portion inspection device 100 may be stably maintained.

As illustrated in FIG. 6, whether the junction portion is defective may be detected based on thermal resistance calculated during a process of heating and cooling in a state in which the power module 2 to be inspected is mounted on the junction portion inspection device 100 and the upper and lower substrates 20 are in contact with the cooling block 130. The power module 2 to be inspected, in a state of being mounted on the junction portion inspection device 100, may receive a heating current for heating and a sensing current for measuring voltage.

Since the junction portion inspection device 100 includes a plurality of cooling blocks 130, whether the junction portion is defective for the power module 2 to be inspected may be inspected by the number corresponding to the cooling blocks 130 in one inspection process. In addition, the junction portion inspection device 100 may reduce inspection time by performing heating and cooling within a short time as the cooling blocks 130 contact the upper and lower substrates 20 of the power module 2 to be inspected.

Referring to FIG. 6, the junction portion inspection device 100 may further include a current applying equipment 160, a voltage sensor 170 and a processing unit 180. The current applying equipment 160, the voltage sensor 170 and the processing unit 180 may be electrically connected to at least a portion of the junction portion inspection device 100 and/or the power module 2.

The power module 2 to be inspected may receive current through current applying equipment 160. The current applying equipment 160 may be directly or indirectly connected to the power module 2 to be inspected and apply current. As an example, the current applying equipment 160 may be connected to at least a portion (e.g., the power lead 50 and/or the signal lead 60) of the power module 2 to be inspected by wiring and may be provided to apply current. As another example, the current applying equipment 160 may have a conductive contact pin (or a pogo pin) in contact with at least a portion of the power module 2 to be inspected to electrically connect the power module 2 to be inspected to the current applying equipment 160. According to various exemplary embodiments, the current applying equipment 160 may be included as portion of the junction portion inspection device 100 or may be provided as a separate component from the junction portion inspection device 100.

FIG. 7 is a flowchart of a method for inspecting a junction portion of a power module according to an exemplary embodiment in the present disclosure.

Hereinafter, in describing FIG. 7, the junction portion inspection method is performed on the power module to be inspected (e.g., the power module 2 illustrated in FIG. 5) rather than the power module in the finished product state (e.g., the power module 1 illustrated in FIGS. 1 and 2). However, this corresponds to one of various exemplary embodiments, and as described above, the power module 1 in a finished product state is not excluded from the object to be inspected.

Referring to FIG. 7, in the method for inspecting a junction portion of a power module (S200) according to an exemplary embodiment, thermal resistance may be measured and whether a junction portion is defective may be quantitatively detected based on the measured thermal resistance value. Here, the junction portion may refer to a junction member (e.g., the junction member 90 in FIG. 2) that joins some components of the power module 2 to each other or at least one of a junction part, junction surface, and junction region formed by the junction member 90.

Hereinafter, the method for inspecting a junction portion of a power module (S200) of FIG. 7 may be performed by the junction portion inspection device 100 described with reference to FIGS. 3, 4, and 6.

Meanwhile, the junction portion inspection device 100 shown in FIGS. 3, 4, and 6 corresponds to one example, and the junction portion inspection device 100 may further include other configurations in addition to those shown in FIGS. 3, 4, and 6. For example, the junction portion inspection device 100 includes the current applying equipment 160 that applies current (e.g., a sensing current and/or a heating current) to the power module 2, and a voltage sensor 170 that measures the voltage of the power module 2, and a processing unit 180 that controls the junction portion inspection device 100.

The method for detecting whether the junction portion of the power module 2 is defective (S200) may include an operation (S210) of mounting a power module on a jig, an operation (S220) of first measuring a voltage, an operation (S230) of applying a heating current to the power module, an operation (S240) of secondly measuring the voltage and cooling the power module, while releasing the application of the heating current, an operation (S250) of calculating the amount of temperature change based on the first and second measured values of the voltage, an operation (S260) of calculating thermal resistance based on the amount of temperature change and the amount of applied power, and an operation (S270) of determining whether the junction portion is defective, based on the calculated thermal resistance.

In the operation (S210) of mounting the power module on the jig, the power module 2 to be inspected may be mounted on the jig for inspection of the junction portion. The operation (S210) of mounting the power module on the jig may include electrically connecting the power module 2 to the current applying equipment. For example, the power module 2 may be electrically connected to the current applying equipment so that current may be applied from the current applying equipment, while mounted on the jig. Here, the jig is an inspection device that may measure thermal resistance by heating and cooling the power module 2, and may be referred to as the junction portion inspection device 100 in FIGS. 3 and 4. However, the jig is not limited to the junction portion inspection device 100 and may be implemented using various devices capable of heating/cooling the mounted power module 2.

In the operation S220 of first measuring the voltage, the voltage first applied to the power module 2 (or the semiconductor device 40) may be measured by applying a sensing current having a predetermined magnitude to the power module 2 (or the semiconductor device 40). For example, the first measured voltage may be a reference voltage (or an initial voltage) for calculating a reference temperature (or an initial temperature) before the power module 2 is heated. The sensing current is used to calculate a temperature of the junction portion, and the temperature of the junction portion may be calculated based on the voltage measured when the sensing current flows. To this end, the sensing current may be a sufficiently small value not causing the power module 2 (or the junction portion) to be heated, and at the same time, may be a value allowing a voltage change to be accurately read.

In the operation S230 of applying a heating current to the power module, the power module 2 may be heated by applying a heating current having a predetermined magnitude to the power module 2 (or the semiconductor device 40). For example, the temperature of the power module 2 (or the junction portion) may be increased by applying the heating current having a specified magnitude to the power module 2 for a reference time. Here, the reference time for which the heating current is applied may be about 1.5 seconds to about 2 seconds. However, the reference time is not limited to the aforementioned value and may be appropriately changed based on at least one of the type, size, structure, and shape of the power module 2. The heating current is intended to increase the temperature of the power module 2 (or the junction portion of the power module 2) and may be greater than the sensing current in the operation S220.

In the operation S240 of secondly measuring the voltage and cooling the power module, while releasing the application of the heating current, the power module 2 may be heated by applying the heating current for the reference time, and then the application of the heating current is released, and at the same time, the voltage secondarily applied to the power module 2 (or the semiconductor device 40) is measured by applying a sensing current, and the power module 2 may be cooled. For example, the secondarily measured voltage may be a change voltage for calculating a rising temperature after the power module 2 is heated. The sensing current is the same as the sensing current in operation S220. Cooling of the power module 2 is to move the power module 2 to the next process and may be performed substantially immediately after measuring the secondary voltage. The secondary voltage measurement and cooling may be performed for a time of about 2.5 seconds to about 4 seconds. For example, in the operation S240, the application of the heating current may be released and the sensing current is applied at the same time to measure the voltage secondarily, and the power module 2 may be cooled immediately after the secondary voltage measurement.

In the operation S250 of calculating the amount of temperature change based on the first and second measured values of voltage, the initial temperature of the junction portion is calculated based on the first measured voltage and the increased temperature of the junction portion may be calculated based on the secondarily measured voltage to calculate the amount of temperature change. Since the semiconductor device 40 of the power module 2 has physical property characteristics in which the relationship between voltage and temperature forms a linear function, the temperature may be calculated with the measured voltage using the linear function defining the relationship between voltage and temperature. For example, the semiconductor device 40 of the power module 2 has a unique physical characteristic in which the voltage drops in a linear slope as the temperature rises, and a linear function between voltage and temperature is calculated in advance, and based on this, the temperature is calculated from the measured voltage. That is, because the semiconductor device 40 has a corresponding specific voltage at a specific temperature, the temperature of the junction portion may be easily calculated from the measured voltage.

The linear function between voltage and temperature for the operation S250 may be calculated by placing the power module 2 in a plurality of temperature conditions and then measuring the voltage at each temperature. For example, the power module 2 may be controlled to have temperatures of about 25° C., about 40° C., about 55° C., and about 70° C., voltages at the respective temperatures may be measured, and a linear function between the voltages and the temperatures may be defined. A plurality of temperature conditions for measuring the voltages may have the same difference, but are not limited thereto. In addition, the plurality of temperature conditions for measuring the voltages is not limited to four. The method of calculating the linear function between voltages and temperatures is not limited to the aforementioned example, and may be calculated through various methods.

Meanwhile, the linear function between the voltages and the temperatures may be calculated in advance before the method for inspecting a junction portion of a power module (S200) according to an exemplary embodiment is performed or before the operation S210. The method of calculating the temperature from the voltage takes into account the difficulty of measuring the temperature by disposing a temperature sensor to be adjacent to the junction portion in the double-sided cooling power module 2, and according to this, thermal resistance may be calculated without a temperature sensor for measuring temperature.

According to various exemplary embodiments, the calculating of the initial temperature and the increased temperature of the junction portion in operation S250 may be performed together with measuring of the voltage in operations S220 and S240, respectively.

In the operation S260 of calculating thermal resistance based on the amount of temperature change and the amount of applied power, the thermal resistance may be calculated based on the amount of power applied in operation S230 and the amount of temperature change in operation S250. The thermal resistance is a value obtained by dividing the amount of temperature change by the amount of applied power and may be calculated using Equation 1 below.

$$Rth = \frac{\Delta T}{\Delta P} = \frac{\Delta \text{Thermal}}{\Delta \text{Power}} \quad \text{Equation 1}$$

Equation 1 above is a thermal resistance equation, in which Rth is the thermal resistance, $\Delta T$ is the amount of temperature change, and $\Delta P$ is the amount of applied power.

In the operation S270 of determining whether the junction portion is defective, based on the calculated thermal resistance, whether the junction portion is defective may be determined by comparing the calculated thermal resistance value with a reference value. For example, if a defect, such as voids and/or lack of density, occurs in the junction portion, the thermal resistance value of the junction portion increases compared to a normal product. Therefore, if the calculated thermal resistance value is higher than the reference value of the normal product, it may be determined that the junction portion is defective. According to this, since whether the junction portion is defective is determined based on quantitative thermal resistance values, detection may be performed accurately and objectively.

Meanwhile, at least some of the operations included in the method for inspecting a junction portion of a power module (S200) according to an exemplary embodiment may be omitted, and at least some of the operations described above may be performed simultaneously or in a changed order.

According to an exemplary embodiment in the present disclosure, the accuracy of defect detection may be improved by determining whether the junction portion of the power module is defective using quantitative thermal resistance values.

In addition, according to an exemplary embodiment in the present disclosure, it is possible to increase process efficiency and reduce material costs by detecting defects in the junction portion while the power module is not a finished product before the molding process is performed.

In addition, according to an exemplary embodiment in the present disclosure, a process cycle time (C/T) may be improved by shortening the time required to measure thermal resistance.

While example exemplary embodiments have been illustrated and described above, it will be apparent to those skilled in the art that modifications and variations could be made without departing from the scope of the present disclosure as defined by the appended claims.

The invention claimed is:

1. A method for inspecting a junction portion of a power module, the method comprising:

measuring a primary voltage, by a voltage sensor, for the power module;

applying a heating current to the power module, by a current applying equipment, to heat the power module;

releasing, by a processing unit, the heating current and simultaneously measuring, by the voltage sensor, a secondary voltage for the power module;

cooling the power module, by the processing unit;

calculating, by the processing unit, a temperature change amount based on the measured value of the primary voltage and the measured value of the secondary voltage;

calculating, by the processing unit, thermal resistance based on an amount of power applied to the power module and the calculated amount of temperature change; and determining, by the processing unit, whether the junction portion of the power module is defective, based on the calculated thermal resistance;

wherein, in the determining whether the junction portion of the power module is defective, the junction portion is determined to be defective when the calculated thermal resistance is higher than a reference thermal resistance value.

2. The method of claim 1, wherein measuring the primary voltage and measuring the secondary voltage each include applying a sensing current to at least a portion of the power module.

3. The method of claim 2, wherein:

the sensing current is applied to a semiconductor device included in the power module; and in the measuring of the primary voltage and the measuring of the secondary voltage, a voltage applied to the semiconductor device when the sensing current flows is measured.

4. The method of claim 2, wherein:

the sensing current is applied to calculate a temperature of the junction portion provided in the power module; and the heating current is applied to heat at least a portion of the power module to a predetermined temperature.

5. The method of claim 2, wherein the sensing current has a lower intensity than an intensity of the heating current.

6. The method of claim 2, wherein calculating the amount of temperature change includes calculating an initial temperature of the junction portion based on the measured value of the primary voltage, and calculating an increased temperature of the junction portion based on the measured value of the secondary voltage.

7. The method of claim 6, wherein calculating the temperature with the voltage is performed based on a function defining between voltage and temperature, and the function is predetermined.

8. The method of claim 7, wherein the function is calculated by measuring a voltage applied to at least a portion of the power module under a plurality of temperature conditions.

9. The method of claim 1, wherein:

applying the heating current is performed for a first reference time; and measuring the secondary voltage and cooling the power module are each performed for a second reference time, the second reference time being longer than the first reference time.

10. A method for inspecting a junction portion of a power module, the method comprising:

measuring a primary voltage, by a voltage sensor, for the power module;

applying a heating current to the power module, by a current applying equipment, to heat the power module;

releasing, by a processing unit, the heating current and simultaneously measuring, by the voltage sensor, a secondary voltage for the power module;

cooling the power module, by the processing unit;

calculating, by the processing unit, a temperature change amount based on the measured value of the primary voltage and the measured value of the secondary voltage;

calculating, by the processing unit, thermal resistance based on an amount of power applied to the power module and the calculated amount of temperature change; and determining, by the processing unit, whether the junction portion of the power module is defective, based on the calculated thermal resistance;

wherein the power module to be inspected is a double-sided cooling power module and comprises a semiconductor device bonded to upper and lower substrates through a junction member before being molded.

* * * * *